(12) United States Patent
Suzuki et al.

(10) Patent No.: US 7,960,745 B2
(45) Date of Patent: Jun. 14, 2011

(54) LIGHT EMITTING DEVICE AND METHOD OF FABRICATING THE SAME

(75) Inventors: Yukari Suzuki, Gunma (JP); Jun Ikeda, Gunma (JP); Jun-ya Ishizaki, Gunma (JP); Shunichi Ikeda, Gunma (JP)

(73) Assignee: Shin-Etsu Handotai Co., Ltd., Toyko (JP)

( * ) Notice: Subject to any disclaimer, the term of this patent is extended or adjusted under 35 U.S.C. 154(b) by 370 days.

(21) Appl. No.: 12/303,662

(22) PCT Filed: May 29, 2007

(86) PCT No.: PCT/JP2007/060852
§ 371 (c)(1),
(2), (4) Date: Dec. 5, 2008

(87) PCT Pub. No.: WO2007/142071
PCT Pub. Date: Dec. 13, 2007

(65) Prior Publication Data
US 2010/0270568 A1    Oct. 28, 2010

(30) Foreign Application Priority Data
Jun. 5, 2006    (JP) .................................. 2006-156723

(51) Int. Cl.
*H01L 33/02* (2010.01)
(52) U.S. Cl. ........... 257/96; 257/E33.023; 257/E33.005; 438/46

(58) Field of Classification Search ............... 257/96, 257/101, 102, 103, E33.001, E21.001, E33.005, 257/E33.023; 438/46, 47
See application file for complete search history.

(56) References Cited

U.S. PATENT DOCUMENTS

| 6,586,773 B2 | 7/2003 | Saeki et al. | |
| 2009/0152584 A1* | 6/2009 | Grillot et al. | 257/101 |

FOREIGN PATENT DOCUMENTS

| JP | 2000-200924 A | 7/2000 |
| JP | 2002-203987 A | 7/2002 |
| JP | 2005-38995 A | 2/2005 |
| JP | 2005-259912 A | 9/2005 |
| JP | 2005-317664 A | 11/2005 |

* cited by examiner

*Primary Examiner* — Thomas L Dickey
*Assistant Examiner* — Fazli Erdem
(74) *Attorney, Agent, or Firm* — Arent Fox LLP

(57) ABSTRACT

A light emitting device comprises a light emitting layer section having a double heterostructure of an n-type cladding layer, an active layer and a p-type cladding layer, each composed of AlGaInP stacked in this order. Supposing a bonding object layer having a first main surface side as p type and a second main surface side as n type, a light extraction side electrode is formed to cover the first main surface partially. An n-type transparent device substrate composed of Group III-V compound semiconductor having greater band gap energy than the active layer is bonded to the second main surface of the bonding object layer. On one sides of the transparent device substrate and the bonding object layer, a bonding surface to the other is formed, and an InGaP intermediate layer is formed to have a high concentration Si doping layer formed on the bonding surface side.

12 Claims, 7 Drawing Sheets

FIG.4
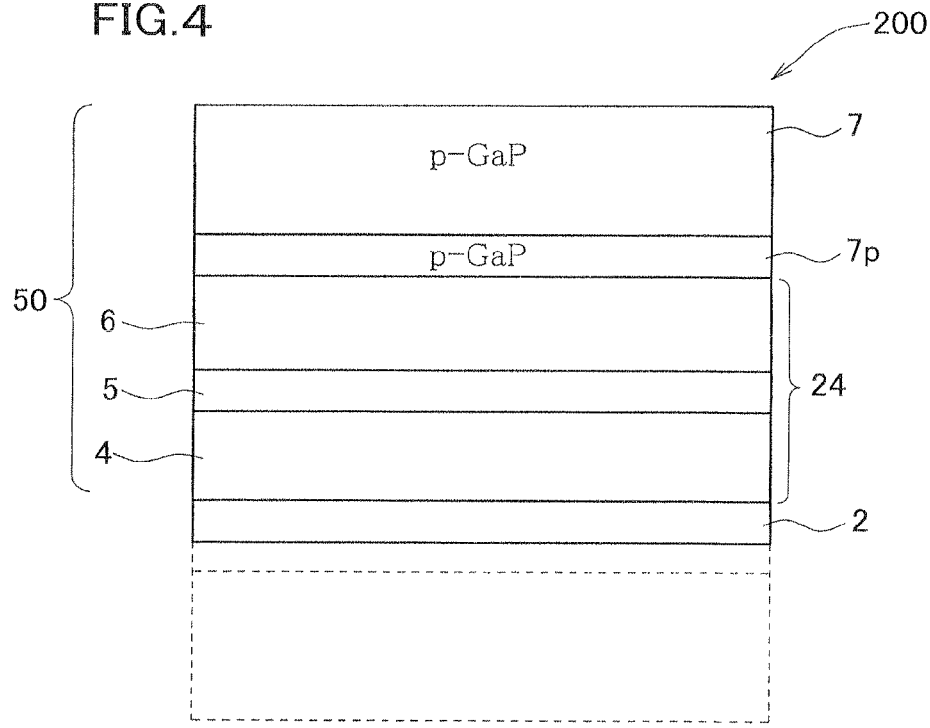
STEP4
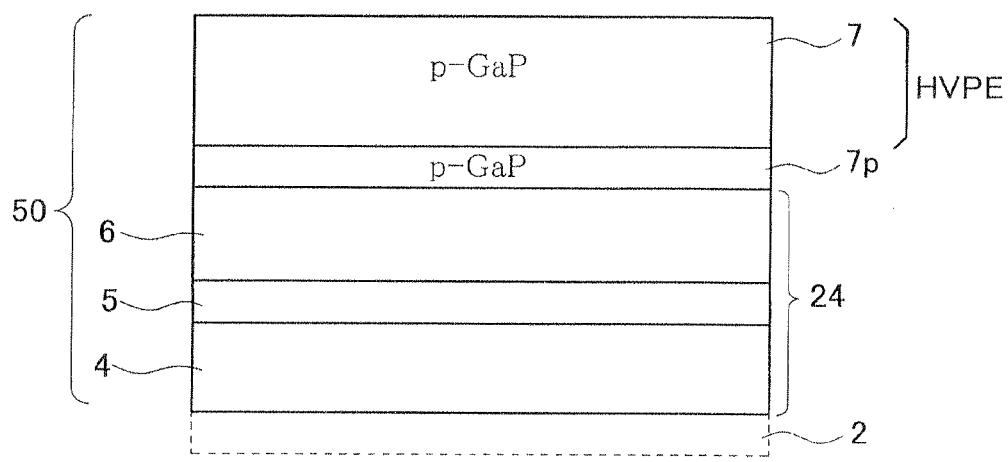
STEP5

FIG.5
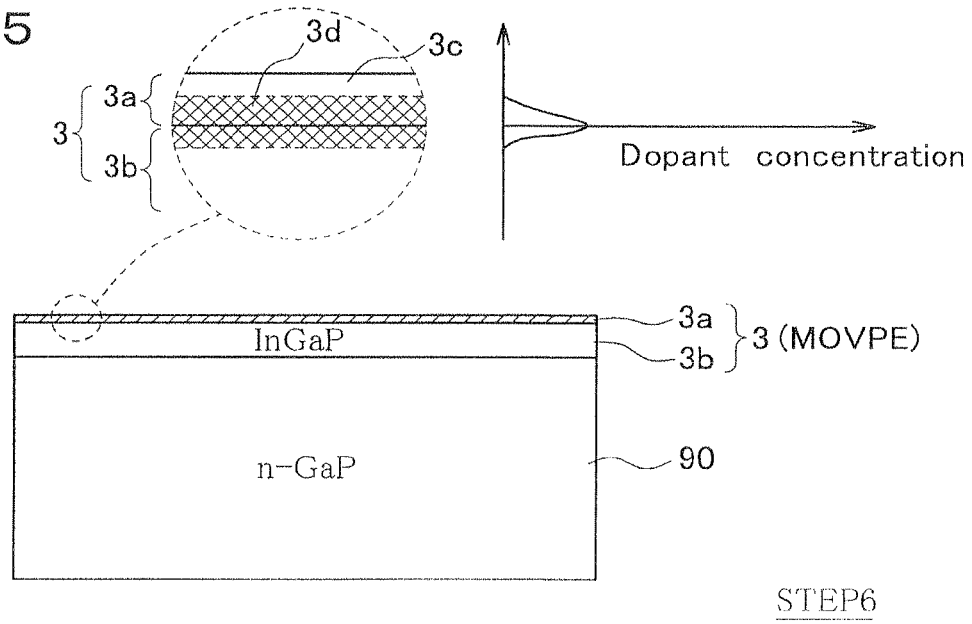
STEP6
⇓
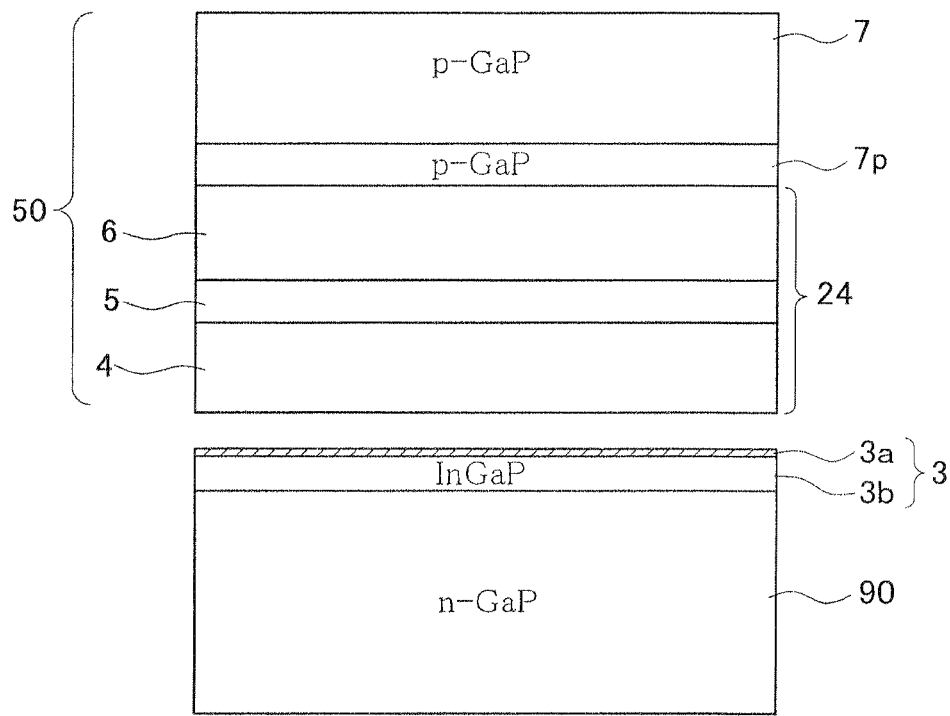
STEP7

FIG.6
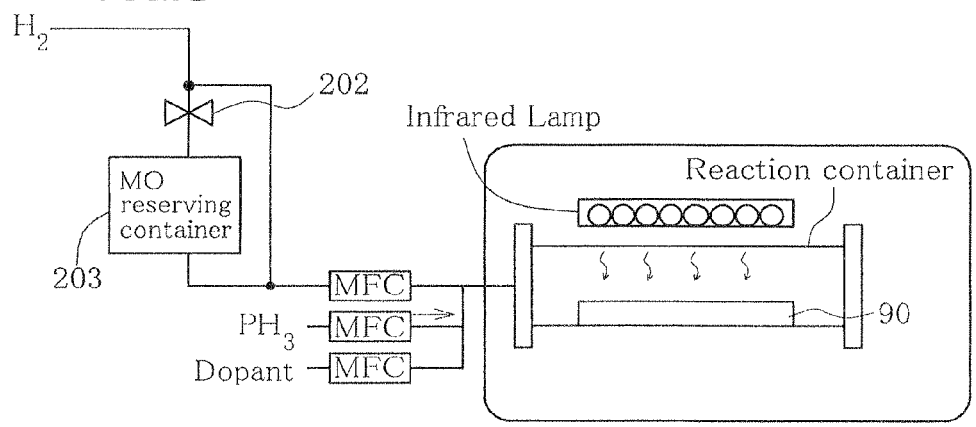
STEP61
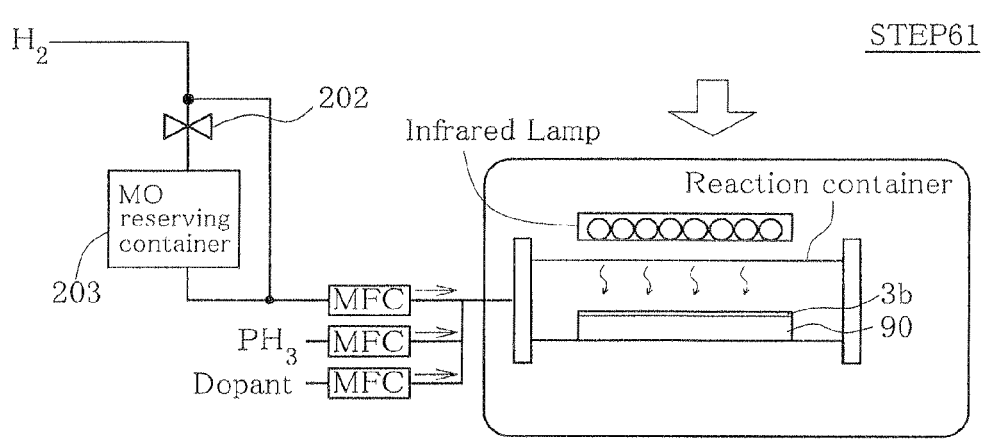
STEP62
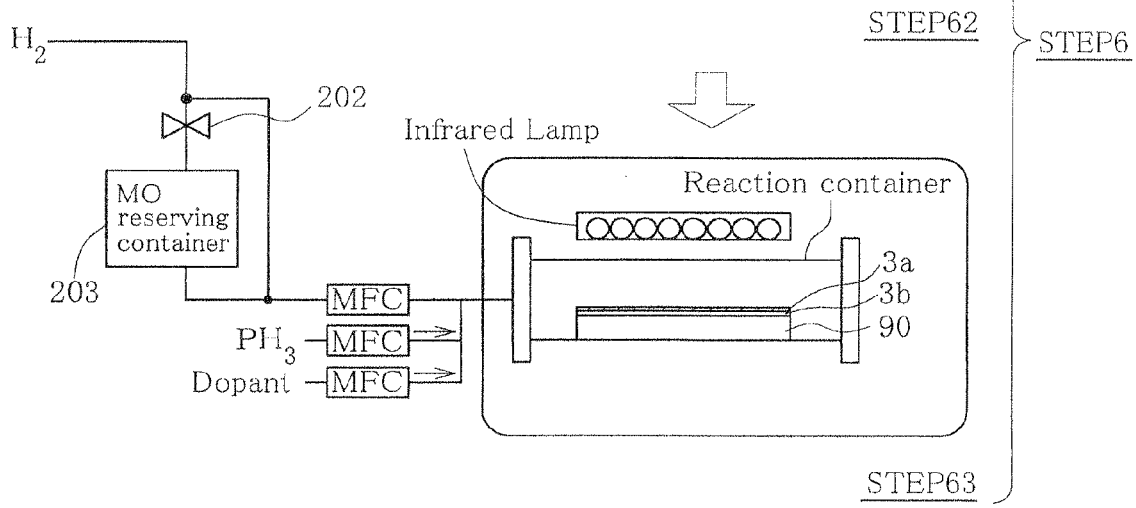
STEP63
STEP6

LIGHT EMITTING DEVICE AND METHOD OF FABRICATING THE SAME

RELATED APPLICATIONS

This application is a National Stage entry of International Application No. PCT/JP2007/060852, filed May 29, 2007, and claims the priority of Japanese Patent Application No. 2006-156723 filed on Jun. 5, 2006. The disclosures of the prior applications are hereby incorporated herein in their entirety by reference.

BACKGROUND OF THE INVENTION

1. Field of the Invention

This invention relates to a light emitting device and a method of fabricating the same.

2. Description of the Related Art

[Patent Document 1] Japanese Laid-Open Patent Publication No. 2002-203987

A light emitting device having a light emitting layer section thereof composed of an $(Al_xGa_{1-x})_yIn_{1-y}P$ alloy (where, $0 \leq x \leq 1$, $0 \leq y \leq 1$; simply referred to as AlGaInP alloy, or more simply as AlGaInP, hereinafter) can be realized as a high-luminance device, by adopting a double heterostructure in which a thin AlGaInP active layer is sandwiched between an n-type AlGaInP cladding layer and a p-type AlGaInP cladding layer, both having a larger band gap than the active layer.

In a case of an AlGaInP light emitting device, a GaAs substrate is used as a growth substrate of the light emitting layer section, however GaAs absorbs light greatly in a light emitting wavelength range of the AlGaInP light emitting layer section. Thus, Patent Document 1 discloses a method of separating a GaAs substrate once and then bonding a new GaP substrate. Also, according to Patent Document 1, the GaP substrate bonding side is p type, in order to decrease series resistance on a bonding interface, an intermediate layer composed of InGaP having Zn added at high concentration is grown on a bonding side of the light emitting layer section as a p-type dopant, and the intermediate layer is bonded to the GaP substrate.

SUMMARY OF THE INVENTION

For a direct bonding type light emitting device explained the above, an intermediate layer used for bonding is p type, and Zn, which has relatively high oxidative resistance as a dopant, can be used. However it is difficult to obtain a p-type GaAs single crystal substrate for growing an AlGaInP light emitting layer epitaxially, and it is not an exaggeration to say that only n-type ones are used for actual production. In this case, a GaP substrate is bonded to a second main surface side, which is n type, of the light emitting layer section having the GaAs single crystal substrate removed, and an InGaP intermediate layer used for bonding as well as the GaP substrate need to be changed to n-type ones.

However, regarding Group III-V compound semiconductor, Si is often used as an n-type dopant, and an InGaP intermediate layer needs to be doped with Si at high concentration. According to our inventors' study, it's found out that it is difficult to dope Si evenly on the entire InGaP intermediate layer, unevenness of Si concentration can easily occur on its surface as a bonding surface, and because oxygen mixed in bonding atmosphere oxidizes Si on the surface so as to be inactivated, it is difficult to decrease series resistance on the bonding interface compared with a p-type InGaP intermediate layer.

Further, it's also found out that in a case of doping Si to the InGaP intermediate layer at high concentration, series resistance of the light emitting device obtained by bonding not only merely increases, but also loses stability, such that the series resistance is likely to decrease temporarily along with continuous current application. In a case that the series resistance does not decrease to a stable level in a short time, when the light emitting device is driven with light control by high speed switching (PWM control or the like), there would be a problem influencing greatly to its switching response.

A problem of this invention is to provide a light emitting device and a method of fabricating the same, achieving full decrease of device series resistance on a bonding interface and also its switching response, in a case that bonding surface sides of a light emitting layer section and a transparent conductive semiconductor substrate are n type, and that an InGaP intermediate layer formed on the bonding surface side is n type by doping of Si.

In order to solve the above problem, the light emitting device of this invention, comprises a bonding object layer provided with a light emitting layer section, composed of Group III-V compound semiconductor, having a double heterostructure of an n-type cladding layer, an active layer and a p-type cladding layer, each composed of AlGaInP having composition lattice-matched with GaAs, stacked in this order, set to have a first main surface side as p type and a second main surface side as n type, having a light extraction side electrode formed to cover the first main surface partially, and a structure that an n-type transparent device substrate, composed of Group III-V compound semiconductor having greater band gap energy than the active layer, is bonded to the second main surface of the bonding object layer, wherein on one sides of the transparent device substrate and the bonding object layer, bonding surfaces to the other are formed, and an InGaP intermediate layer, comprising a high concentration Si doping layer having concentrated Si as an n-type dopant formed on the bonding surface side, is formed.

A method of fabricating the light emitting device of this invention comprises a bonding object layer growth step of growing epitaxially the bonding object layer on a first main surface of a single crystal growth substrate composed of GaAs, so as to obtain an intermediate stack, a substrate removal step of removing the single crystal growth substrate from the intermediate stack, an InGaP intermediate layer growth step of growing epitaxially the InGaP intermediate layer on one of a first main surface of the n-type transparent device substrate and a second main surface of the bonding object layer having the single crystal growth substrate removed, and forming the high concentration Si doping layer on the bonding surface side of the InGaP intermediate layer, and a bonding step of bonding the n-type transparent device substrate and the bonding object layer on the bonding surface of the InGaP intermediate layer having the high concentration Si doping layer formed, conducted in this order.

Regarding the above invention, when the n-type transparent device substrate is bonded on the second main surface, which is to be n type, of the bonding object layer, the bonding is conducted while forming the n-type InGaP intermediate layer doped with Si on a bonding surface side of either at least one of these, and also the high concentration Si doping layer having concentrated Si, which is to be an n-type dopant, is formed locally in a thickness direction on the bonding surface side of the InGaP layer. Herewith, even though Si, which is easily oxidizable, is used as a dopant, series resistance of the bonding interface can be decreased fully, and variation of the series resistance after starting current application is small and stable, for example, for use of a light emitting device driven with light control by high-speed switching or the like, its switching response can be improved greatly.

Also, "AlGaInP lattice-matched with GaAs" means compound semiconductor, supposing that a lattice constant of the semiconductor is "a1", assumed in bulk crystal state having no lattice variation occurring by stress, and similarly a lattice constant of GaAs is "a0", having a lattice mismatch rate expressed with {|a1−a0|/a0}×100(%) within 1%. In addition, the active layer may be configured as a single layer of AlGaInP, also it may be configured as a quantum well layer stacked alternately with barrier layers and well layers each composed of AlGaInP having different compositions (The entire quantum well layer is considered as one active layer).

Regarding the n-type transparent device substrate, for example, an n-type GaP single crystal substrate can be manufactured easily at low cost, also has high transparency, so that it can be adopted to this invention preferably (In addition to this, a single crystal substrate such as GaAsP, GaAlAs or the like, can be adopted)

The high concentration Si doping layer formed on the InGaP intermediate layer is desirably adjusted to have Si concentration of $2\times10^{19}/cm^3$ or more and $6\times10^{19}/cm^3$ or less. When the Si concentration of the high concentration Si doping layer is less than $2\times10^{19}/cm^3$, series resistance decreasing effect on the bonding interface tends to be insufficient. On the other hand, when Si concentration of the high concentration Si doping layer exceeds $6\times10^{19}/cm^3$, it is sometimes difficult to maintain bonding strength between the InGaP intermediate layer and the bonding object layer, for example, after conducting the bonding step, separation or the like can easily occur between the InGaP intermediate layer and the bonding object layer. In this case, Si concentration of the bonding surface of the InGaP intermediate layer is preferably adjusted to be less than $3\times10^{19}/cm^3$ before conducting the bonding step in a similar perspective. Corresponding to this, the high concentration Si doping layer is preferably adjusted to have Si concentration of $3\times10^{19}/cm^3$ or more and $6\times10^{19}/cm^3$ or less.

Before conducting the bonding step, the high concentration Si doping layer of the InGaP intermediate layer is preferably covered with an InGaP cap layer having lower Si concentration than the high concentration Si doping layer. In this case, a bonding surface is formed on the InGaP cap layer. The high concentration Si doping layer covered with the InGaP cap layer can decrease Si concentration on the bonding surface of the InGaP intermediate layer, and effectively prevent increase of series resistance and decrease of the bonding strength caused by Si oxidization of the bonding surface on the bonding step or the like.

As described above, when Si concentration of the InGaP cap layer surface rises excessively, bonding strength between the InGaP intermediate layer and the bonding object layer becomes insufficient, so that after the bonding step, separation or the like could sometimes occur between the InGaP intermediate layer and the bonding object layer. With this perspective, Si concentration of the InGaP cap layer before the bonding step is desirably less than $3\times10^{19}/cm^3$ (more desirably less than $2\times10^{19}/cm^3$). Also, when thickness of the InGaP cap is adjusted within a range of 10 nm or more and 25 nm or less, effect of preventing the above separation occurrence is even more remarkable.

The InGaP intermediate layer can be epitaxially grown on the first main surface of the n-type transparent single crystal substrate. According to this, the InGaP intermediate layer is formed on the n-type transparent single crystal substrate side, which can easily assure required thickness, so that handling during manufacturing is straightforward. In this case, the high concentration Si doping layer can be formed on the first main surface side of the InGaP intermediate layer.

Next, the high concentration Si doping layer can be formed specifically, as follows. That is, on the InGaP intermediate layer growth step, the InGaP intermediate layer is formed by flowing material gas of compound semiconductor and Si source dopant gas to form the InGaP intermediate layer in a reaction chamber by MOVPE (Metal-Organic Vapor Phase Epitaxy) method, and once a compound semiconductor layer comprising the InGaP intermediate layer has been grown to have a predetermined thickness, the high concentration Si doping layer is formed on a surface portion of the InGaP intermediate layer by decreasing relative flowing volume of the material gas to the Si source dopant gas supplied in the reaction chamber. According to this, on the vapor phase growth step of the InGaP intermediate layer by the MOVPE, a forming step of the high concentration Si doping layer can be easily incorporated by flowing volume adjustment of the material gas, and the high concentration Si doping layer can be formed effectively.

In this case, on the InGaP intermediate layer growth step, when the high concentration Si doping layer is formed, by continuing supply of the Si source dopant gas to the reaction chamber while stopping supply of the material gas, the high concentration Si doping layer can be formed precipitously on a narrow thickness area of a surface portion of the InGaP intermediate layer (so called δ doping), so as to increase the effects of this invention further. Also, on the InGaP intermediate layer growth step, when the high concentration Si doping layer is formed, by increasing absolute supply flow volume of the Si source dopant gas to the reaction chamber, the more precipitous high concentration Si doping layer can be obtained. In addition, when forming the high concentration Si doping layer, it is desirable to stop only supply of metal organic gas composing Group III element source of the material gas, but to continue supply of Group V element source gas (P source gas: for example phosphine), so as to suppress separation of P component from the grown InGaP intermediate layer.

Also, on the InGaP intermediate layer growth step, by restarting supply of the material gas after forming the high concentration Si doping layer, the InGaP cap layer to cover the high concentration Si doping layer can be formed easily. Specifically, on the InGaP intermediate layer growth step, a portion of the InGaP intermediate layer grown before stopping supply of the material gas is a second layer, and a portion grown after restarting supply of the material gas is a first layer (That is, the InGaP intermediate layer comprises the first layer disposed on the bonding surface side, and the second layer disposed on the opposite side (for example, thicker than the first layer)). The high concentration Si doping layer is formed over the first layer and the second layer so as to have Si concentration of $2\times10^{19}/cm^3$ or more and $6\times10^{19}/cm^3$ or less (desirably $3\times10^{19}/cm^3$ or more and $6\times10^{19}/cm^3$ or less) and the Si concentration maximum at a boundary position of the first layer and second layer. Then, a surface portion on the bonding surface side of the first layer is considered as the InGaP cap layer having lower Si concentration than the high concentration Si doping layer. On the bonding step, it is preferable to conduct the bonding on a surface of the InGaP cap layer. Also, regarding this invention, "to stop supply of the material gas" means to decrease flow volume of the material gas to 1/10 or less. In other words, even in a case of "during outage", supply of the material gas can be continued, if it is an amount as small as 1/10 or less of the flow volume before the outage. In this case, even during the outage the InGaP intermediate layer continue to be grown even at low speed, and a portion grown during the outage is considered to be included in the second layer.

BRIEF DESCRIPTION OF THE DRAWINGS

FIG. 4 is a conceptual drawing continuous from FIG. 3.
FIG. 5 is a conceptual drawing continuous from FIG. 4.
FIG. 6 is a conceptual drawing showing details of STEP 6.

BEST MODES FOR CARRYING OUT THE INVENTION

Hereinafter, embodiments of this invention will be explained referring to the attached drawings.

Figure 1:
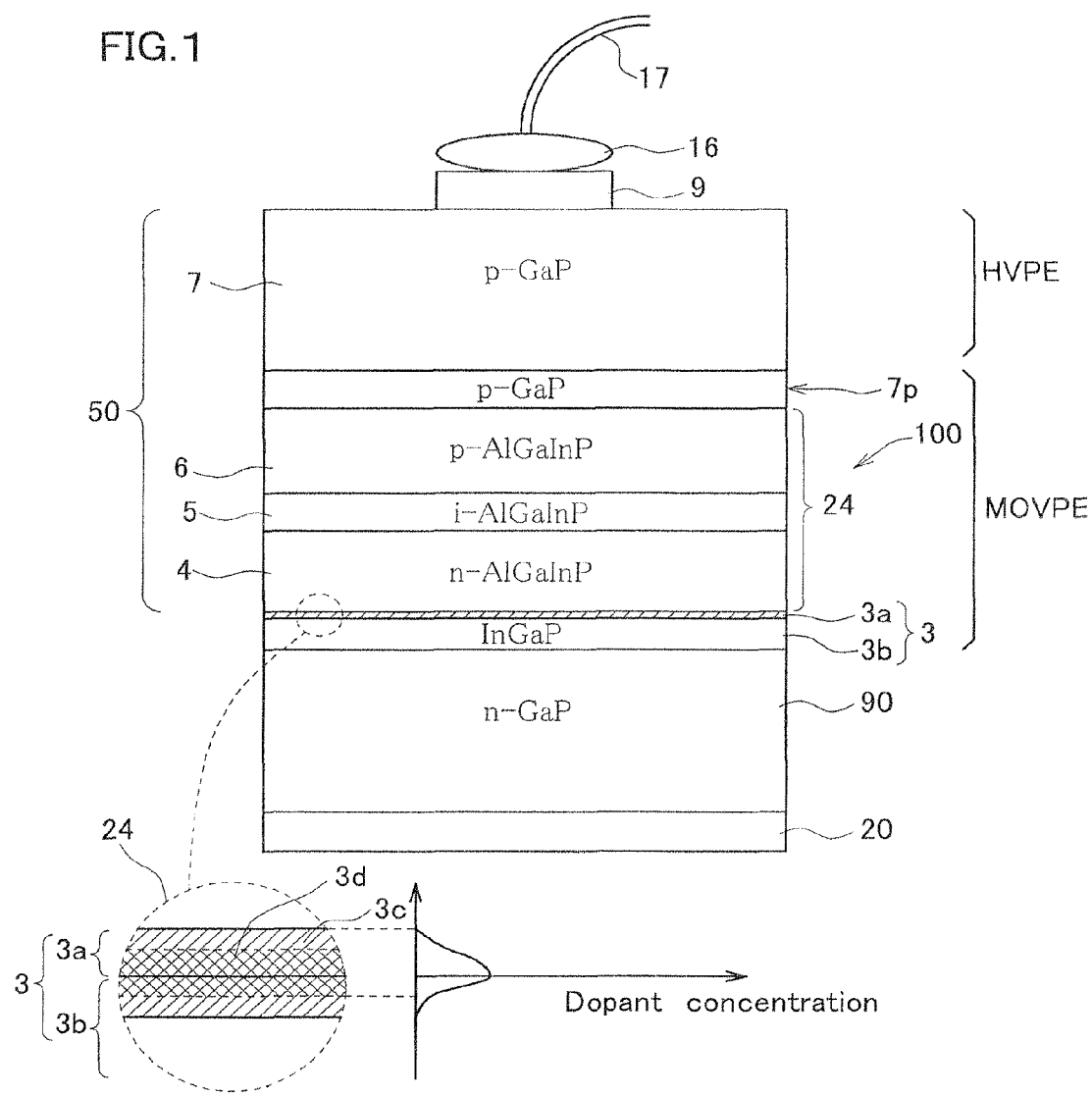
FIG. 1 is a schematic drawing showing an example of a light emitting device subject to application of this invention with a stack structure.

FIG. 1 is a schematic drawing showing a light emitting device 100, an embodiment of this invention. The light emitting device 100 is provided with a bonding object layer 50 set to comprise a light emitting layer section 24, and have a first main surface side asp type and a second main surface side as n type, and a light extraction side electrode 9 is formed to cover the first main surface partially. The light emitting layer section 24, composed of Group III-V compound semiconductor, has a double heterostructure of an n-type cladding layer 4, an active layer 5 and a p-type cladding layer 6, each composed of AlGaInP having composition lattice-matched with GaAs, stacked in this order. An n-type transparent device substrate 90, composed of Group III-V compound semiconductor having greater band gap energy than the active layer 5, is bonded to the second main surface of the bonding object layer 50. Then, an InGaP intermediate layer 3 is formed on one of the n-type transparent device substrate 90 and the bonding object layer 50, on a first main surface of the n-type transparent device substrate 90 in this embodiment, and a high concentration Si doping layer $3d$ having concentrated Si to be an n-type dopant is formed on the bonding surface side on the first main surface of the InGaP intermediate layer 3.

Specifically, when the InGaP intermediate layer 3 is expressed with a composition formula such as $In_AGa_{1-A}P$, InP alloy ratio A is adjusted 0.05 or more and 0.1 or less, and comprises a first layer $3a$ disposed on the bonding surface side, and a second layer $3b$ (for example, thicker than the first layer $3a$) disposed on the opposite side. The high concentration Si doping layer $3d$ is formed over the first layer $3a$ and the second layer $3b$ so as to have the Si concentration maximum at a boundary position of the first layer $3a$ and the second layer $3b$ and decreasing monotonically from that position to each layer thickness direction. The high concentration Si doping layer $3d$ is a region having Si concentration of $2 \times 10^{19}$/cm$^3$ or more and $6 \times 10^{19}$/cm$^3$ or less (preferably $3 \times 10^{19}$/cm$^3$ or more and $6 \times 10^{19}$/cm$^3$ or less). The InGaP intermediate layer 3 has thickness of, for example, 20 nm or more and 100 nm or less.

Also, under the device state after completing the bonding step, on a surface layer portion of the first layer $3a$ on a bonding surface side, an InGaP cap layer $3c$, which will be explained below, may be formed so as to have Si concentration of less than $3 \times 10^{19}$/cm$^3$ (preferably less than $2 \times 10^{19}$/cm$^3$). However, as explained below, it is not a problem if the region has Si concentration of $3 \times 10^{19}$/cm$^3$ or more (or $2 \times 10^{19}$/cm$^3$ or more) by diffusion, and then the InGaP cap layer $3c$ disappears as a result.

The transparent device substrate 90 is an n-type GaP single crystal substrate (hereinafter called as n-type GaP single crystal substrate 90), and a second main surface thereof is covered entirely with a back surface electrode 20. A light extraction side electrode 9 is formed on approximately center of a first main surface of a current spreading layer 7, and a region around the light extraction side electrode 9 is a light extraction region from the light emitting layer section 24. Also a bonding pad 16 composed of Au or the like is disposed, in order to bond electrode wire 17, on a center portion of the light extraction side electrode 9.

The light emitting layer section 24 is grown by MOVPE method, and composed of compound semiconductor having composition lattice-matched with GaAs out of compound semiconductor expressed with a composition formula of $(Al_xGa_{1-x})_yIn_{1-y}P$ (where, $0 \leq x \leq 1$, $0 \leq y \leq 1$). Specifically, the light emitting layer section 24 has a structure in which the active layer 5 composed of a non-doped $(Al_xGa_{1-x})_yIn_{1-y}P$ alloy (where, $0 \leq x \leq 0.55$, $0.45 \leq y \leq 0.55$) is held between the p-type cladding layer 6 composed of a p-type $(Al_zGa_{1-z})_yIn_{1-y}P$ alloy (where, $x \leq z \leq 1$), and the n-type cladding layer 4 composed of an n-type $(Al_zGa_{1-z})_yIn_{1-y}P$ alloy (where, $x \leq z \leq 1$). The light emitting device 100 shown in FIG. 1 has the p-type AlGaInP cladding layer 6 disposed on the light extraction side electrode 9 side, and the n-type AlGaInP cladding layer 4 disposed on the back surface electrode 20 side. Accordingly, polarity of the electrode is positive on the light extraction side electrode 9 side. It is to be noted that "non-doped" in the context herein means "not intentionally added with a dopant", and never excludes possibility of any dopant components inevitably included in the normal fabrication process (up to $10^{13}$ to $10^{16}$/cm$^3$ or around, for example).

On the other hand, the current spreading layer 7 is formed as a p-type GaP layer having Zn (Mg or combination of Zn and Mg may be used) as a dopant. The current spreading layer 7 is formed by Hydride Vapor Phase Epitaxial Growth Method (HVPE method) and its forming thickness is, for example, 5 μm or more and 200 μm or less (150 μm as an example). Also, between the current spreading layer 7 and the light emitting layer section 24, a p-type GaP connection layer $7p$ is formed by MOVPE method to be continuous to the light emitting layer section 24. That means the bonding object layer 50 comprises the light emitting layer section 24 and the GaP connection layer $7p$ grown by MOVPE method, and the current spreading layer 7 grown by HVPE method.

A method of fabricating the light emitting device 100 in FIG. 1 will be explained, as follows.

Figure 2:
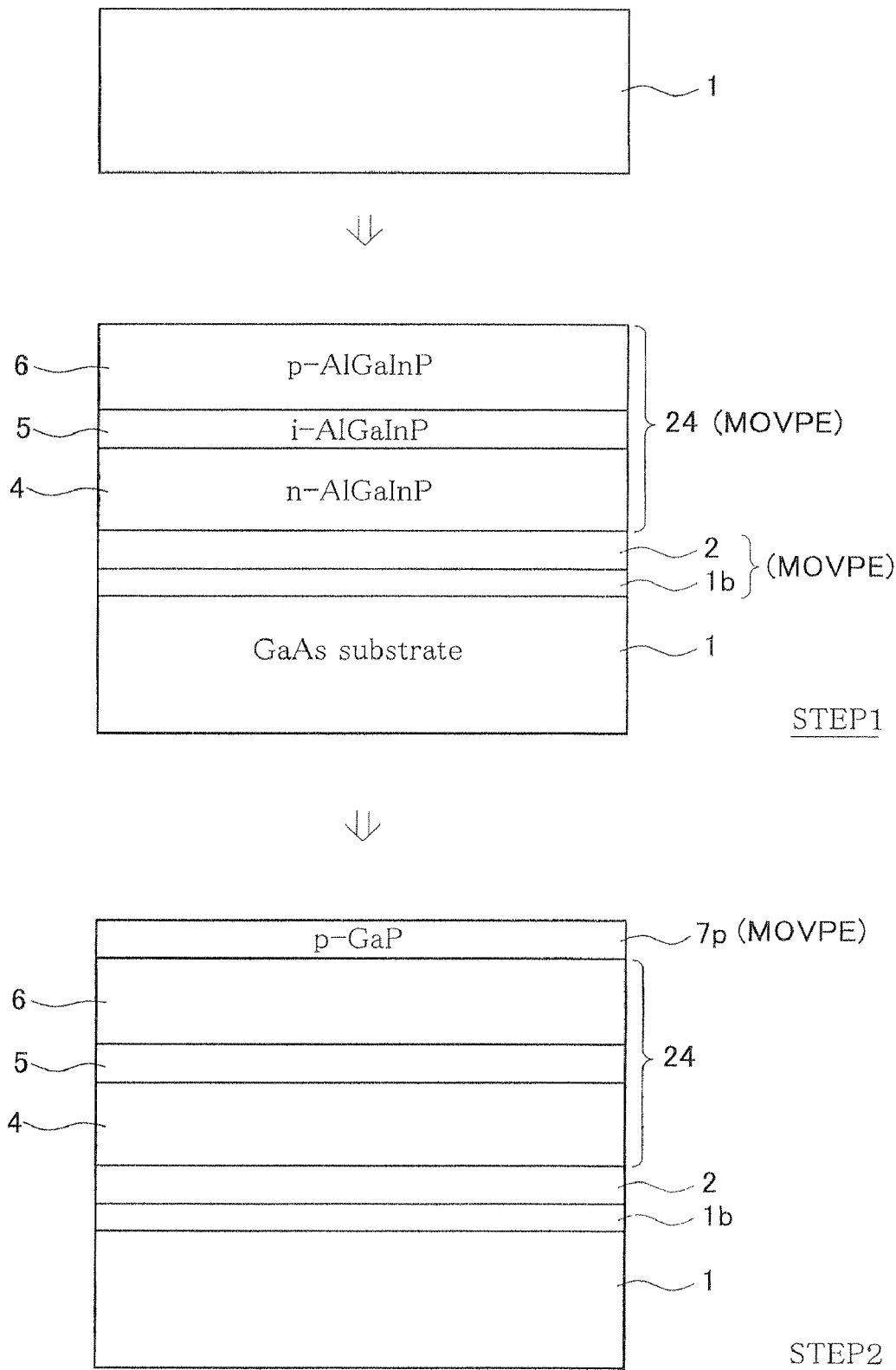
FIG. 2 is a conceptual drawing showing fabricating steps of the light emitting device of FIG. 1.

First, as shown in FIG. 2, An n-type GaAs single crystal substrate 1 is prepared as a single crystal growth substrate (opaque to light emitting flux from the light emitting layer section 24 (having smaller bad gap energy than the active layer 5)). Then, as shown in STEP 1, on a first main surface of the substrate 1, an n-type GaAs buffer layer $1b$, for example, of 0.5 μm, next an etch stop layer 2 composed of AlInP of 0.5 μm, and then as the light emitting layer section 24, an n-type cladding layer 4 of 1 μm (n-type dopant is Si), an active layer 5 (non-doped) of 0.6 μm and a p-type cladding layer 6 of 1 μm (p-type dopant is Mg:C from metal organic molecules can contribute as the p-type dopant), respectively composed of $(Al_xGa_{1-x})_yIn_{1-y}P$ are grown in this order epitaxially. Next, on STEP 2, a connection layer $7p$ composed of p-type GaP is hetero-epitaxially grown on the light emitting layer section 24 by the MOVPE method.

The above-described individual layers are epitaxially grown by any publicly-known MOVPE method. Source gases available as sources of the individual components Al, Ga, In (indium) and P (phosphorus) include the followings:

Al source gas: trimethyl aluminum (TMAl), triethyl aluminum (TEAl), etc.;

Ga source gas: trimethyl gallium (TMGa), triethyl gallium (TEGa), etc.;

In source gas: trimethyl indium (TMIn), triethyl indium (TEIn), etc.; and

P source gas: trimethyl phosphorus (TMP), triethyl phosphorus (TEP), phosphine($PH_3$), etc.

Figure 3:
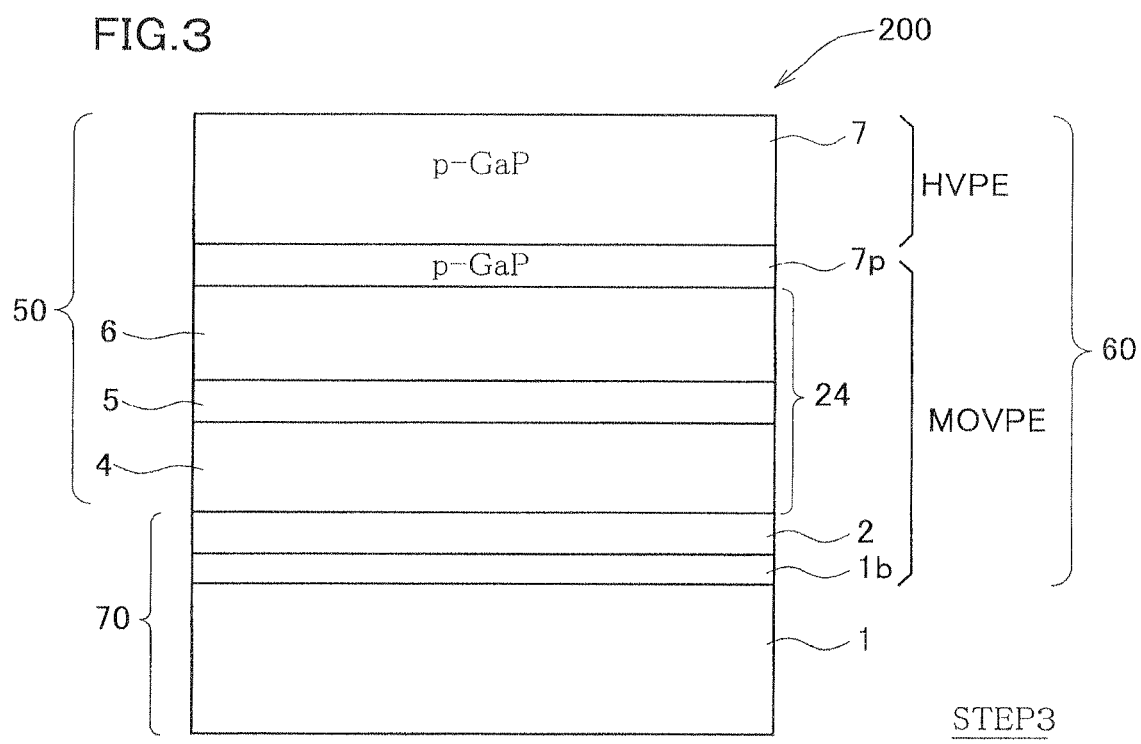
FIG. 3 is a conceptual drawing continuous from FIG. 2.

Next, proceeded to STEP3 in FIG. 3, the current spreading layer 7 composed of a p-type GaP is homo-epitaxially grown on the connection layer 7p by HVPE method. The HVPE method proceeds, specifically as Ga as a Group III element is heated and kept at a predetermined temperature in a container, and hydrogen chloride is introduced over Ga to thereby produce GaCl through a reaction expressed by the formula (1) below, and then supplies it over the substrate together with $H_2$ gas as a carrier gas:

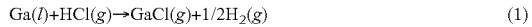

$$Ga(l)+HCl(g) \rightarrow GaCl(g)+1/2H_2(g) \quad (1)$$

The growth temperature is typically set to 640° C. to 860° C., both ends inclusive, wherein P as a Group V element is supplied on the substrate in a form of $PH_3$, together with $H_2$ as a carrier gas. Zn as a p-type dopant is supplied in a form of DMZn (dimethyl Zn). GaCl is excellent in reactivity with $PH_3$, and can effectively grow the current spreading layer 7 according to the reaction expressed by the formula (2) below:

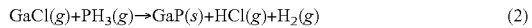

$$GaCl(g)+PH_3(g) \rightarrow GaP(s)+HCl(g)+H_2(g) \quad (2)$$

By following the above steps so far, on the GaAs single crystal substrate 1, a compound semiconductor growth layer 60 is epitaxially grown by two types of the vapor phase growth methods, so as to form an intermediate stack 200. The intermediate stack 200 comprises the bonding object layer 50 including the light emitting layer section 24, the connection layer 7p and the current spreading layer 7, and a non-device-to-be section 70 including the rest (the etch stop layer 2, the buffer layer 1b and the GaAs single crystal substrate 1). On the other hand, on MOVPE growth step, the light emitting layer section 24 and the connection layer 7p of the bonding object layer 50, and the preceding etch stop layer 2 and buffer layer 1b are formed.

Next, proceeded to STEP4 in FIG. 4, the GaAs single crystal substrate 1 is removed. The removal is conducted by polishing the GaAs single crystal substrate 1 from the second main surface side so as to decrease the substrate thickness to some extent, removing the GaAs single crystal substrate 1 and the buffer layer 1b by etching using a first etching solution having selective etchability to GaAs (for example, ammonia/hydrogen peroxide mixture), and then, as shown in STEP5, removing the etch stop layer 2 by etching using a second etching solution having selective etchability to AlInP composing the etch stop layer 2 (for example, hydrochloric acid: may be added with fluorine for Al oxidization layer removal). Also, an AlAs separation layer may be formed instead of the etch stop layer 2, and selectively etched so as to remove the GaAs single crystal substrate 1 by separating the GaAs single crystal substrate 1 from the bonding object layer 50.

Next, as shown in STEP6 of FIG. 5, an InGaP intermediate layer 3 of, for example, 20 nm or more and 100 nm or less is epitaxially grown on the first main surface of the n-type GaP single crystal substrate 90 (for example, thickness of 280 μm). Then, a high concentration Si doping layer 3d is formed on a bonding surface side of the InGaP intermediate layer 3. Epitaxial growth of the InGaP intermediate layer 3 is conducted by MOVPE method similarly to the light emitting layer section 24.

Figure 7:
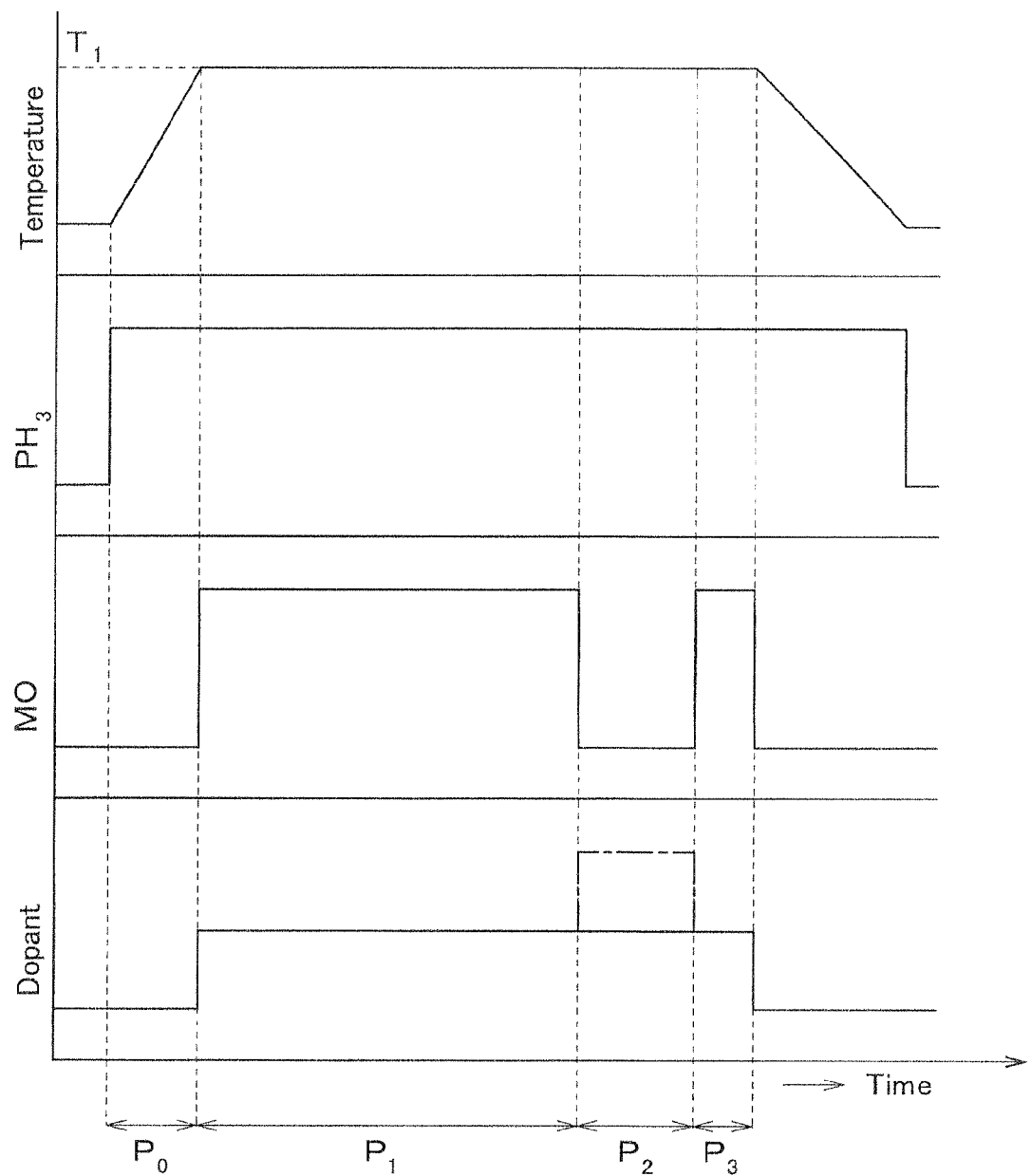
FIG. 7 is a schematic drawing showing an example of a timing chart corresponding to STEP 6.

FIG. 6 shows details of the growth step of the InGaP intermediate layer 3. Inside of a reaction chamber is heated to a growth temperature (for example, 900° C. or more and 1100° C. or less) by heating source (an infrared lamp in this embodiment). Source gas are organic metal (MO) gas to be Group III metal source and Group V element source gas (phosphine($PH_3$) for here). By holding the MO gas in a metal-made MO reservoir 203, and then introducing a carrier gas composed of hydrogen gas into the MO reservoir 203, organic metal inside, being attenuated with the carrier gas, is pushed into a supply tube, and then supplied to the reaction chamber by controlling the flow volume with a mass flow controller (MFC). In addition, The carrier gas can be supplied to the reaction chamber by bypassing the MO reservoir 203 with control of a bypass valve 202. Also, the Group V element source gas and the Si source dopant gas (silane($SH_4$) for here) are also respectively supplied to the reaction chamber by controlling flow volume thereof with the mass flow controller (MFC). FIG. 7 shows a schematic timing chart of gas supply and elevated temperature for each step.

First, as shown in STEP 61 of FIG. 6, the n-type GaP single crystal substrate 90 is disposed in the reaction chamber, and by starting supply of Group V element source gas only, inside of the reaction chamber is purged with the Group V element source gas, as well as starting elevation of a temperature to a growth temperature T1 (FIG. 7: period $P_0$). Then, once reached to the growth temperature T1, as shown in STEP 62, by supplying as material gas the MO gas, the Group V element source gas and the Si source dopant gas, The InGaP intermediate layer 3 (the second layer 3b) starts to be grown by the MOVPE method (FIG. 7: period $P_1$).

Once the second layer 3b is grown to have a predetermined thickness (for example, 30 nm), relative flow volume of the material gas, to be supplied to the reaction chamber, to the Si source dopant gas is decreased. In this embodiment, while only continuing supply of the Si source dopant gas at the same flow volume, supply of the MO gas only is stopped. Because of this, on a surface of the InGaP intermediate layer 3 which has stopped being grown, a layer having Si concentrated and absorbed from the Si source dopant gas (FIG. 7: period $P_2$). Length of the period $P_2$ is set to have Si concentration of the high concentration Si doping layer 3d mentioned below of $2 \times 10^{19}/cm^3$ or more and $6 \times 10^{19}/cm^3$ or less (preferably $3 \times 10^{19}/cm^3$ or more and $6 \times 10^{19}/cm^3$ or less), while calculating flow volume of the Si source dopant gas. In addition, during the period $P_2$, supply of the Group V element source gas ($PH_3$) is continued, so as to aim to suppress decomposition of the grown InGaP. Also, in FIG. 7, as shown with dashed lines, the flow volume of the Si source dopant gas during the period $P_2$ can be increased more than the flow volume during the period $P_1$.

Once finishing the high concentration Si doping layer 3d, while continuing supply of the Si source dopant gas, supply of the MO gas is restarted so as to grow the first layer 3a (FIG. 7: period $P_3$, for example, thickness of 20 nm).

At this time, as shown in STEP 6 of FIG. 5, Si of a Si concentrated and absorbed layer formed on a surface of the second layer 3b during growth stop period is diffused respectively on the first layer 3a, which will be grown from that interface position, and the second layer 3b, which has been grown. As a result, the high concentration Si doping layer 3d is formed over the first layer 3a and the second layer 3b, so as to have Si concentration of $2 \times 10^{19}/cm^3$ or more and $6 \times 10^{19}/cm^3$ or less (desirably, $3 \times 10^{19}/cm^3$ or more and $6 \times 10^{19}/cm^3$ or less) and the Si concentration maximum at a boundary position of the first layer 3a and second layer 3b. The Si concentration has a profile which monotonically decreases from a boundary position of the both layers having the maximum Si concentration to each thickness direction respectively. On the bonding surface side, a region having Si concentration less than $3\times10^{19}/cm^3$ (desirably, less than $2\times10^{19}/cm^3$) is the InGaP cap layer 3c, and a bonding surface is formed on the InGaP cap layer 3c. The InGaP cap layer 3c has thickness of 10 nm or more and 25 nm or less (however, less than thickness of the first layer 3a, naturally).

On the first layer 3a side, InGaP growth and Si diffusion proceeds concurrently, so that the high concentration Si doping layer 3d tends to have thickness greater on the first layer 3a side. Also, in this embodiment, thickness of the first layer 3a is set to be less than that of the second layer 3b, so as to contribute to improve bonding strength on the bonding step further. In addition, before conducting the bonding step, in order to maintain Si concentration on the first layer 3a surface (that is a bonding surface) of $3\times10^{19}/cm^3$ or less (desirably, $2\times10^{19}/cm^3$ or less), thickness thereof is adjusted (in other words, in order to form the InGaP cap layer 3c).

Once finished growing the first layer 3a having required thickness, supply of the MO gas and the Si source dopant gas is stopped, and while continuing supply of the carrier gas only through the bypass route, heating with the infrared lamp is stopped so as to cool down to a room temperature. Even during this cooling time, supply of the Group V element source gas ($PH_3$) is continued, so as to aim to suppress decomposition of the grown InGaP.

Returning to FIG. 5, as shown in following STEP7, a bonding-annealing is conducted, as the formed n-type GaP single crystal substrate 90 having the InGaP intermediate layer 3 formed comprising the high concentration Si doping layer 3d, having a first main surface of the InGaP intermediate layer 3 as a bonding surface, is put together and pressed with a second main surface of the bonding object layer 50, and further heated to 400° C. or more and 700° C. or less (Application of pressure can be continued during the bonding-annealing).

During this bonding-annealing, Si of the high concentration Si doping layer 3d is diffused to the bonding surface, and, as shown in FIG. 1, the Si concentration around the bonding surface is increased. This is considered to contribute to decrease of series resistance of the bonding interface, reduction of variation of the series resistance after applying current, or the like. Also, after bonding, the Si concentration on the bonding surface may exceed $2\times10^{19}/cm^3$ (or $3\times10^{19}/cm^3$) (It means that regarding the resultant light emitting device after the bonding step, the InGaP cap layer 3c having Si concentration of $3\times10^{19}/cm^3$ or less (or $2\times10^{19}/cm^3$ or less) can disappear).

By following the above steps, a semiconductor wafer for fabricating the light emitting device is completed. Then, a light extraction side electrode 9 and a back surface electrode 20 are formed on each chip region of this semiconductor wafer for fabricating the light emitting device by vacuum evaporation, and further a bonding pad 16 is disposed on the light extraction side electrode 9, and baked at a appropriate temperature for setting the electrode. While dicing the wafer to individual chips, bonding the back surface electrode 20 with conductive paste such as Ag paste to a terminal electrode also as a support, not shown in a figure, Au-made wire 17 is bonded over the bonding pad 16 and another terminal electrode, and further resin mold is formed, so as to obtain the light emitting device 100.

In order to confirm effects of this invention, a light emitting device sample of the embodiment obtained by forming the high concentration Si doping layer 3d and conducting the bonding as explained above, and a comparative light emitting device sample obtained by forming no high concentration Si doping layer 3d by omitting the period P2 in FIG. 7, were formed respectively, and supposing forward voltage Vf just after starting applying current with 20 mA as a initial value, a reduced value of the forward voltage Vf, decreasing to a stable value of the Vf while continuing current application, was calculated as ΔVf. As a result, the light emitting device sample of this embodiment had Vf of 1 to 4% and ΔVf of 10 to 40% smaller respectively to the comparative light emitting device sample, and thus remarkable improvement was found out.

What is claimed is:

1. A light emitting device, comprising
a bonding object layer provided with a light emitting layer section, composed of Group III-V compound semiconductor, having a double heterostructure of an n-type cladding layer, an active layer and a p-type cladding layer, each composed of AlGaInP having composition lattice-matched with GaAs, stacked in this order, set to have a first main surface side as p type and a second main surface side as n type, having a light extraction side electrode formed to cover the first main surface partially, and
a structure that an n-type transparent device substrate, composed of Group III-V compound semiconductor having greater band gap energy than the active layer, is bonded to the second main surface of the bonding object layer, wherein
on one sides of the transparent device substrate and the bonding object layer, bonding surfaces to the other are formed, and
an InGaP intermediate layer, comprising a high concentration Si doping layer having concentrated Si as an n-type dopant formed on the bonding surface side, is formed.

2. The light emitting device as claimed in claim 1, wherein the n-type transparent device substrate comprises an n-type GaP single crystal substrate.

3. The light emitting device as claimed in claim 2, wherein the high concentration Si doping layer has Si concentration of $2\times10^{19}/cm^3$ or more and $6\times10^{19}/cm^3$ or less.

4. The light emitting device as claimed in claim 1, wherein the InGaP intermediate layer comprises a first layer disposed on the bonding surface side, and a second layer disposed on the opposite side, and
the high concentration Si doping layer is formed over the first layer and the second layer so as to have the Si concentration maximum at a boundary position of the first layer and the second layer and decreasing monotonically from that position to each layer thickness direction.

5. The light emitting device as claimed in claim 1, wherein the InGaP intermediate layer is epitaxially grown on a first main surface of the n-type transparent single crystal substrate, and the high concentration Si doping layer is formed on a first main surface side of the InGaP intermediate layer.

6. A method of fabricating the light emitting device as claimed in claim 1, comprising
a bonding object layer growth step of growing epitaxially the bonding object layer on a first main surface of a single crystal growth substrate composed of GaAs, so as to obtain an intermediate stack,
a substrate removal step of removing the single crystal growth substrate from the intermediate stack, an InGaP intermediate layer growth step of growing epitaxially the InGaP intermediate layer on one of a first main surface of the n-type transparent device substrate and a second main surface of the bonding object layer having the single crystal growth substrate removed, and forming the high concentration Si doping layer on the bonding surface side of the InGaP intermediate layer, and a bonding step of bonding the n-type transparent device substrate and the bonding object layer on the bonding surface of the In GaP intermediate layer having the high concentration Si doping layer formed, conducted in this order.

7. The method of fabricating the light emitting device as claimed in claim 6, wherein Si concentration of the bonding surface of the high concentration Si doping layer is adjusted to less than $3\times10^{19}/cm^3$ before conducting the bonding step.

8. The method of fabricating the light emitting device as claimed in claim 6, wherein
on the InGaP intermediate layer growth step, the InGaP intermediate layer is formed by flowing material gas of compound semiconductor and Si source dopant gas to form the InGaP intermediate layer in a reaction chamber by MOVPE method, and
once a compound semiconductor layer comprising the InGaP intermediate layer has been grown to have a predetermined thickness, the high concentration Si doping layer is formed on a surface portion of the InGaP intermediate layer by decreasing relative flowing volume of the material gas to the Si source dopant gas supplied in the reaction chamber.

9. The method of fabricating the light emitting device as claimed in claim 8, wherein on the InGaP intermediate layer growth step, when forming the high concentration Si doping layer, supply of the material gas stops while continuing supply of the Si source dopant gas to the reaction chamber.

10. The method of fabricating the light emitting device as claimed in claim 9, wherein when forming the high concentration Si doping layer, only supply of metal organic gas composing Group III element source of the material gas stops and supply of Group V element source gas continues.

11. The method of fabricating the light emitting device as claimed in claim 9, wherein on the InGaP intermediate layer growth step, when forming the high concentration Si doping layer, absolute supply flow volume of the Si source dopant gas to the reaction chamber is increased.

12. The method of fabricating the light emitting device as claimed in claim 6, wherein
on the InGaP intermediate layer growth step, provided with a portion of the InGaP intermediate layer grown before stopping supply of the material gas as the second layer, and a portion grown after restarting supply of the material gas as the first layer,
the high concentration Si doping layer is formed over the first layer and the second layer so as to have Si concentration of $2\times10^{19}/cm^3$ or more and $6\times10^{19}/cm^3$ or less and the Si concentration maximum at a boundary position of the first layer and the second layer,
a surface portion on the bonding surface side of the first layer comprises an InGaP cap layer having lower Si concentration than the high concentration Si doping layer, and
on the bonding step, the bonding is conducted on a surface of the InGaP cap layer.

* * * * *